United States Patent
Yamagami et al.

(10) Patent No.: US 9,252,261 B2
(45) Date of Patent: Feb. 2, 2016

(54) SEMICONDUCTOR DEVICE AND MANUFACTURING METHOD OF THE SAME

(75) Inventors: Shigeharu Yamagami, Yokohama (JP); Tetsuya Hayashi, Yokosuka (JP); Taku Shimomura, Atsugi (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/112,097

(22) PCT Filed: Feb. 24, 2012

(86) PCT No.: PCT/JP2012/054622
§ 371 (c)(1),
(2), (4) Date: Oct. 16, 2013

(87) PCT Pub. No.: WO2012/144271
PCT Pub. Date: Oct. 26, 2012

(65) Prior Publication Data
US 2014/0042523 A1 Feb. 13, 2014

(30) Foreign Application Priority Data

Apr. 19, 2011 (JP) ................. 2011-092962

(51) Int. Cl.
*H01L 29/78* (2006.01)
*H01L 29/417* (2006.01)
*H01L 27/06* (2006.01)
(Continued)

(52) U.S. Cl.
CPC ........ *H01L 29/7801* (2013.01); *H01L 27/0629* (2013.01); *H01L 29/0623* (2013.01); *H01L 29/165* (2013.01); *H01L 29/41766* (2013.01); *H01L 29/66068* (2013.01); *H01L 29/7803* (2013.01); *H01L 29/7805* (2013.01); *H01L 29/7806* (2013.01); *H01L 29/7813* (2013.01); *H01L 29/1608* (2013.01); *H01L 29/4238* (2013.01)

(58) Field of Classification Search
CPC .................................... H01L 29/7801
USPC .................................. 257/328–330
See application file for complete search history.

(56) References Cited

U.S. PATENT DOCUMENTS 7,138,668 B2   11/2006   Hayashi et al.
7,151,280 B2   12/2006   Hayashi et al.
(Continued)

FOREIGN PATENT DOCUMENTS

EP   1 544 920 A2   6/2005
JP   5-7002 A       1/1993
(Continued)

OTHER PUBLICATIONS

Office Action issued in Japanese Patent Application No. 2013-510915 mailed Feb. 24, 2015 (with translation).

*Primary Examiner* — Matthew W Such
*Assistant Examiner* — Warren H Kilpatrick
(74) *Attorney, Agent, or Firm* — Foley & Lardner LLP (57) ABSTRACT

An anode region 106 is formed on a bottom portion of a trench 105 in which a gate electrode 108 is formed or in a drift region 102 immediately under the trench 105. A contact hole 110 is formed in the trench 105 at a depth reaching the anode region 106. A source electrode 112 is embedded in the contact hole 110 while interposing an inner wall insulating film 111 therebetween. The anode region 106 and the source electrode 112 are electrically connected to each other in a state of being insulated from the gate electrode 108 by the inner wall insulating film 111.

9 Claims, 11 Drawing Sheets

(51) Int. Cl.
  *H01L 29/66* (2006.01)
  *H01L 29/165* (2006.01)
  *H01L 29/06* (2006.01)
  *H01L 29/423* (2006.01)
  *H01L 29/16* (2006.01)

(56) References Cited

U.S. PATENT DOCUMENTS

2002/0047124 A1   4/2002   Kitabatake
2003/0040144 A1   2/2003   Blanchard et al.
2005/0167744 A1*  8/2005   Yilmaz .......................... 257/329
2007/0138546 A1*  6/2007   Kawamura et al. ........... 257/330
2013/0130482 A1*  5/2013   Masuda et al. ................ 438/507

FOREIGN PATENT DOCUMENTS

| JP | 2002-203967 A | 7/2002 |
| JP | 2005-501408 A | 1/2005 |
| JP | 2005-183563 A | 7/2005 |
| JP | 4211642 B2 | 1/2009 |
| JP | 2010-109221 A | 5/2010 |
| JP | 2011-199041 A | 10/2011 |

* cited by examiner

SEMICONDUCTOR DEVICE AND MANUFACTURING METHOD OF THE SAME

TECHNICAL FIELD

The present invention relates to a semiconductor device including a transistor and a diode and to a manufacturing method of the same.

BACKGROUND ART

Heretofore, as this type of technology, for example, one described in a literature shown below has been known (refer to Patent Literature: Japanese Patent Laid-Open Publication No. 2005-183563). This literature describes a technology of a semiconductor device including: a trench-type transistor in which a gate electrode is embedded in a trench; and a diode in which a hetero semiconductor region is used as an anode and a drift region is used as a cathode. The hetero semiconductor region that composes the anode of the diode is arranged along such gate electrodes, which are adjacent to each other, at a predetermined interval therewith so as to be sandwiched between the gate electrodes concerned.

SUMMARY OF INVENTION

In the above-described conventional semiconductor device, the hetero semiconductor region is arranged and formed in a plane direction of a semiconductor substrate with respect to the gate electrodes so as to be adjacent to the gate electrodes. That is to say, a region in which the hetero semiconductor region is to be formed has been required in the plane direction of the semiconductor substrate. As a result, area efficiency of an element in the semiconductor substrate has been poor, and this has been hindrance in the event of enhancing an integration degree.

In this connection, the present invention has been made in consideration of the foregoing problem. It is an object of the resent invention to provide a semiconductor device in which the integration degree is enhanced by increasing the area efficiency, and to provide a manufacturing method of the same.

In order to solve the foregoing problem, the present invention is characterized in that an anode region is formed on a bottom portion of a trench in which a gate electrode is formed or in a drift region immediately under the trench, that a contact hole is formed in the trench at a depth reaching the anode region, that a source electrode is embedded in the contact hole while interposing an inner wall insulating film therebetween, and that the anode region and the source electrode are electrically connected to each other in a state of being insulated from the gate electrode by the inner wall insulating film.

DESCRIPTION OF EMBODIMENTS

By using the drawings, a description is made below of embodiments for carrying out the present invention.
(Embodiment 1)

Figure 1:
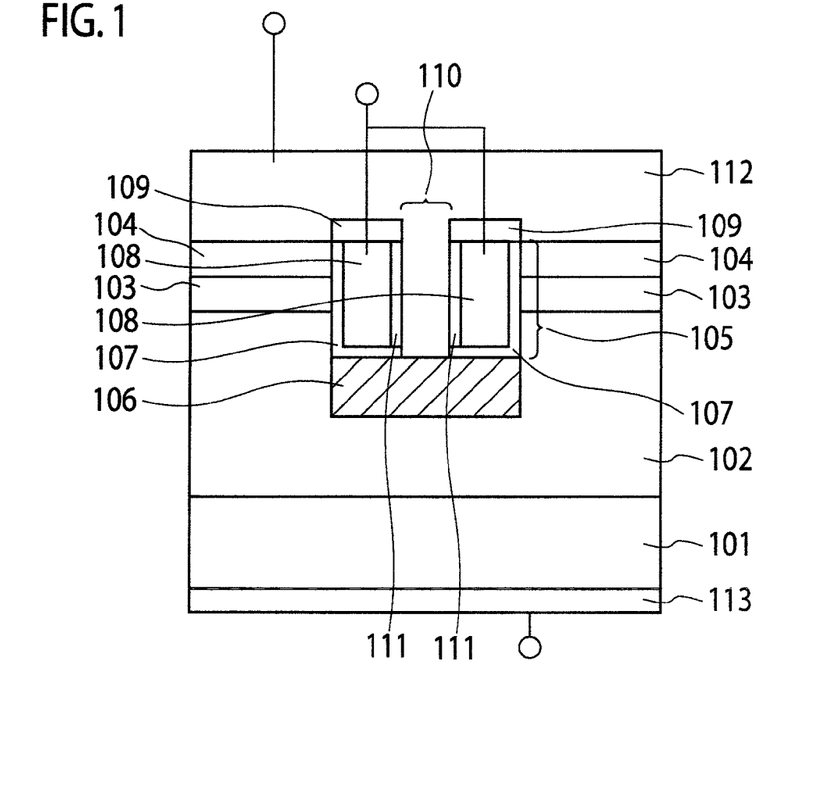
FIG. 1 is a cross-sectional view showing a configuration of a semiconductor device according to Embodiment 1 of the present invention.

FIG. 1 is a view showing a configuration of a semiconductor device according to Embodiment 1 of the present invention. The semiconductor device of Embodiment 1, which is shown in FIG. 1, is composed by using a semiconductor substrate of silicon carbide and including a MOSFET and a diode. In FIG. 1, on one of main surfaces of an N-type high-concentration (N+-type) semiconductor substrate 101 of silicon carbide, a drift region 102 composed of an N-type low-concentration (N−-type) epitaxial layer made of silicon carbide is formed.

On one of main surfaces (that is, a front surface) of the drift region 102, a P-type well region 103 and an N+-type source region 104 are formed. Moreover, there is formed a trench 105 with a depth penetrating the P-type well region 103 and the N+-type source region 104 and reaching the drift region 102. In the drift region 102 immediately under the trench 105, an anode region 106 is formed by selective introduction of impurities, and an upper surface of the anode region 106 forms a bottom surface of the trench 105. This anode region 106 is formed of a P-type conductor in Embodiment 1, composes a PN junction-type diode on a junction surface with the N-type drift region, and functions as an anode of this diode.

On a side surface of the trench 105 and a bottom portion of the trench 105, a gate insulating film 107 is formed so as to contact the drift region 102, the well region 103 and the source region 104. In a side surface of the trench, a gate electrode 108 is embedded while interposing the gate insulating film 107 therebetween. An interlayer insulating film 109 is formed on an upper surface of the gate electrode 108, and coats the gate electrode 108.

In the trench 105, a contact hole 110 is formed so as to be surrounded by the gate electrode 108. In the contact hole 110, a source electrode 112 is formed while interposing therebetween an inner wall insulating film 111 which coats a side surface of the gate electrode 108. The source electrode 112 is formed on the source region 104 and the interlayer insulating film 109. This source electrode 112 connects the source region 104 and the anode region 106 to each other in an ohmic contact that is low in electrical resistance. The source electrode 112 and the gate electrode 108 are insulated from each other by the interlayer insulating film 109 and the inner wall insulating film 111.

On other of the main surfaces (that is, a back surface) of the semiconductor substrate 101, a drain electrode 113 is formed so as to be connected thereto in an ohmic contact that is low in electrical resistance.

Next, by using manufacturing process cross-sectional views shown in FIG. 2A to FIG. 2J, a description is made of a manufacturing method of the semiconductor device according to Embodiment 1.

Figure 2A:
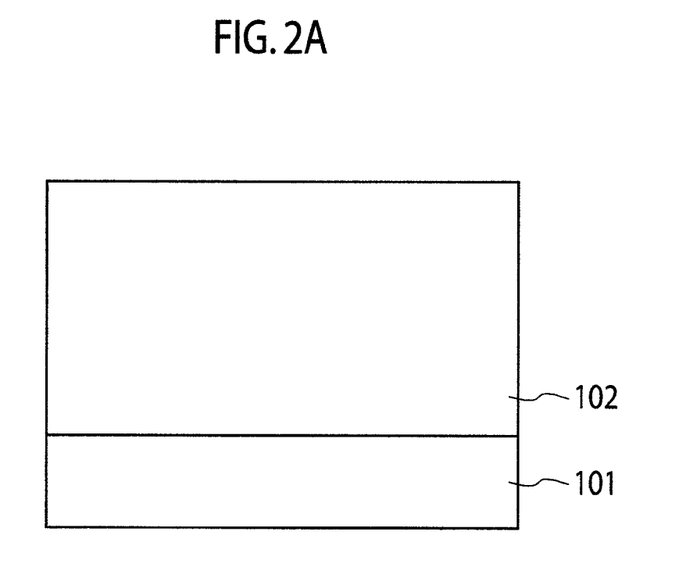
FIG. 2A is a process cross-sectional view showing a manufacturing method of the semiconductor device according to Embodiment 1 of the present invention.

First, in a process shown in FIG. 2A, on such a one main surface of the N+-type semiconductor substrate 101, the drift region 102 composed of the N−-type epitaxial layer of silicon carbide is formed. Silicon carbide has some polytypes (crystal polymorphisms), and here, a description is made on the premise that the polytype is typical 4H. The semiconductor substrate 101 has a thickness ranging approximately from several ten to several hundred micrometers. The drift region 102 is formed, for example, with an impurity concentration ranging from 1E14 to 1E18 cm$^{-3}$ and at a thickness ranging from several to several ten micrometers.

Figure 2B:
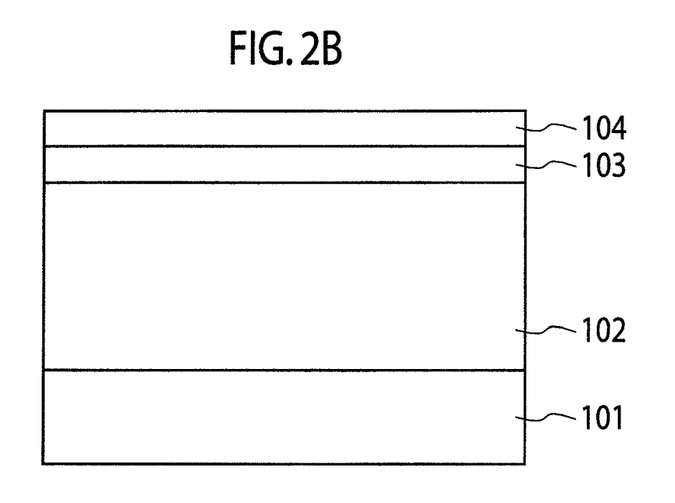
FIG. 2B is a process cross-sectional view showing the manufacturing method of the semiconductor device according to Embodiment 1 of the present invention.

Next, in a process shown in FIG. 2B, the P-type well region 103 and the N+-type source region 104 are formed on the drift region 102 by ion implantation. A mask material may be formed on the drift region 102 by a process, which is shown below, in order to pattern an ion-implanted region. For example, a silicon oxidation film can be used as the mask material, and as a deposition method, a thermal CVD method and a plasma CVD method can be used.

Subsequently, resist is patterned (not shown) on the mask material. As a patterning method, a general photolithography method can be used. The mask material is selectively removed by etching by using the patterned resist as a mask. As an etching method, wet etching using hydrofluoric acid and dry etching such as reactive ion etching can be used.

After the mask material is selectively removed by etching, the resist is removed by oxygen plasma, sulfuric acid and the like. By using the patterned resist as a mask, P-type and N-type impurities are ion-implanted, and the P-type well region 103 and the N+-type source region 104 are formed. As the P-type impurities, for example, aluminum and boron can be used. As the N-type impurities, for example, nitrogen can be used. At this time, such ions are implanted in a state where the semiconductor substrate 101 is heated up to approximately 600° C., whereby a crystal defect can be suppressed from occurring in the implanted region.

After the ion implantation, the mask material is removed, for example, by the wet etching using hydrofluoric acid. Thereafter, the impurities thus ion-implanted are activated by performing heat treatment therefor. As a heat treatment temperature, a temperature of approximately 1700° C. can be used, and as an atmosphere, argon and nitrogen can be suitably used. This heat treatment process may be implemented after a process that is shown in FIG. 2D and described later.

Figure 2C:
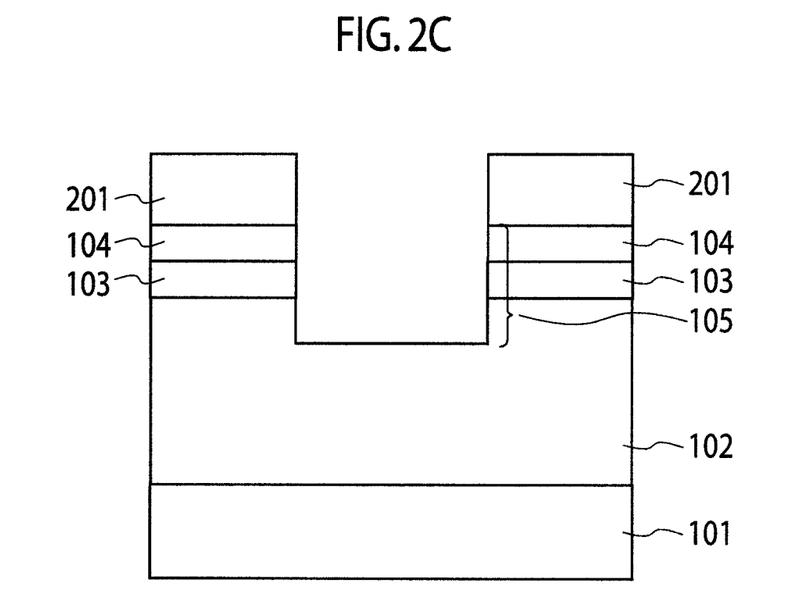
FIG. 2C is a process cross-sectional view showing the manufacturing method of the semiconductor device according to Embodiment 1 of the present invention.

Next, in a process shown in FIG. 2C, the trench 105 is formed in the drift region 102. First, the mask material 201 is formed on the source region 104. As the mask material 201, an insulating film patterned in a similar way to the process previously shown in FIG. 2B can be used. Subsequently, the trench 105 is formed by using the mask material 201 as a mask. As a method for forming the trench, the dry etching method is suitably used. The depth of the trench 105 is set at a depth penetrating the well region 103 and the source region 104 and reaching the drift region 102.

Figure 2D:
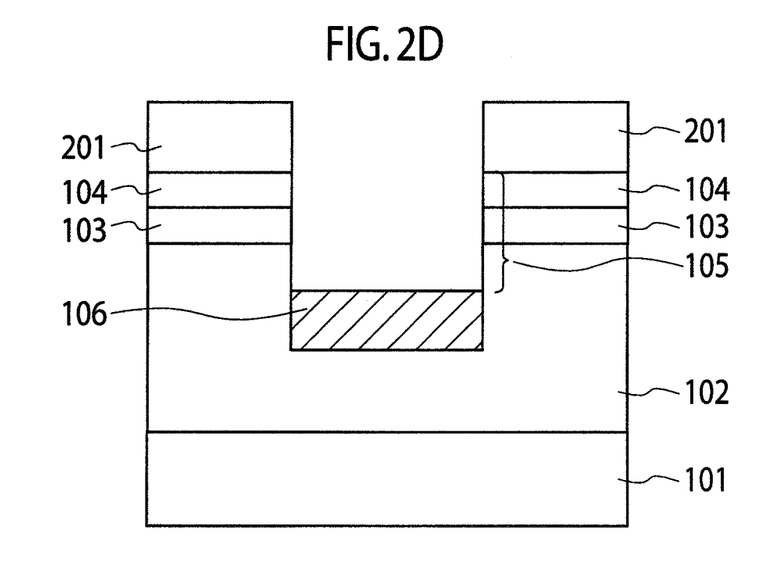
FIG. 2D is a process cross-sectional view showing the manufacturing method of the semiconductor device according to Embodiment 1 of the present invention.

Next, in a process shown in FIG. 2D, the P-type anode region 106 is selectively formed in the drift region 102 immediately under the trench 105. As a forming method of the anode region 106, the ion implantation can be used. As a mask at the time of the ion implantation, the mask material 201 used in the process previously shown in FIG. 2C can be used. In such a way, in the drift region 102 immediately under the trench 105, the anode region 106 can be selectively formed in a self-alignment. Ion species for use in the ion implantation and a substrate temperature are similar to those in the process previously shown in FIG. 2B, and accordingly, are omitted here.

Figure 2E:
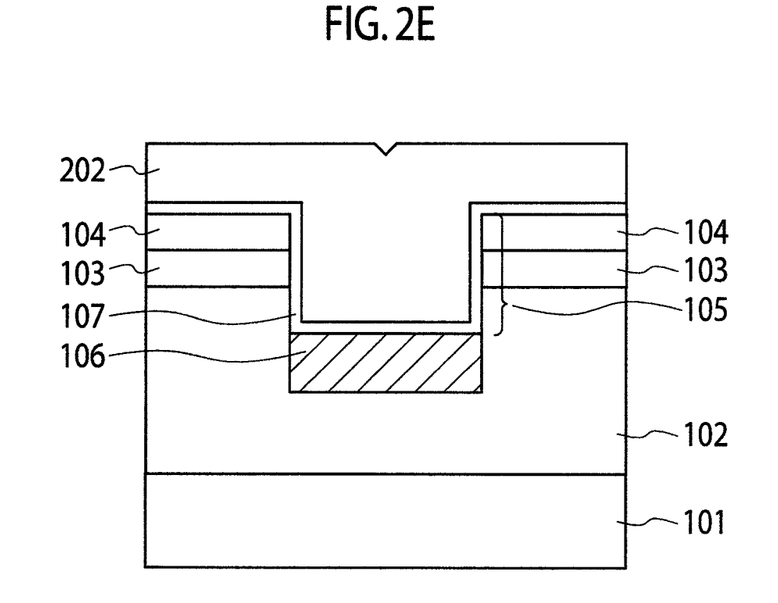
FIG. 2E is a process cross-sectional view showing the manufacturing method of the semiconductor device according to Embodiment 1 of the present invention.

Next, in a process shown in FIG. 2E, on the upper surface of the anode region 106 (that is, the bottom surface of the trench 105), on the side surface of the trench 105 and on the source region 104, the gate insulating film 107 is deposited and formed, for example, at a thickness ranging approximately from 100 to 1000 Å. As the gate insulating film 107, a silicon oxidation film can be suitably used, and as a deposition method, a thermal oxidation method, the thermal CVD method, the plasma CVD method, a sputtering method and the like are used.

After the gate insulating film 107 is deposited and formed, annealing treatment may be performed at a temperature of approximately 1000° C. in an atmosphere of nitrogen, argon, $N_2O$ and the like in order to reduce an interface state between the well region 103 and the gate insulating film 107.

Subsequently, polycrystalline silicon 202, which has impurities introduced thereinto and becomes the gate electrode 108, is deposited and formed in the trench 105 and on the source region 104 while interposing the gate insulating film 107 therebetween. As a deposition method, a general low-pressure CVD method can be used.

Figure 2F:
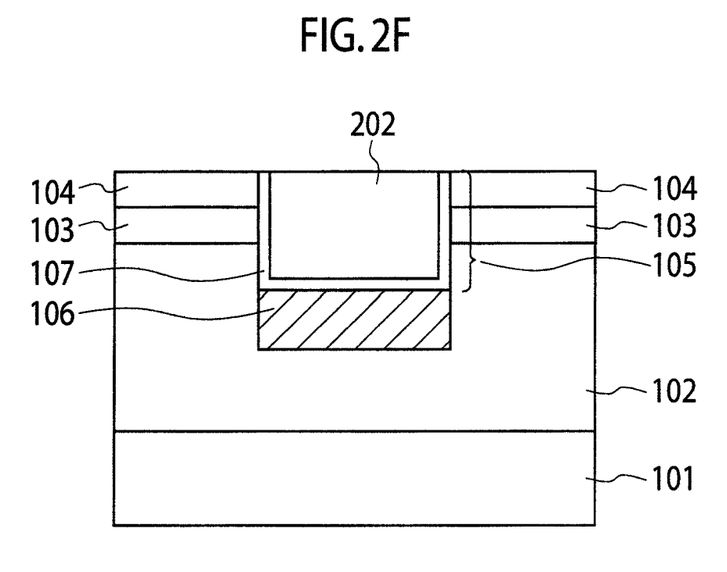
FIG. 2F is a process cross-sectional view showing the manufacturing method of the semiconductor device according to Embodiment 1 of the present invention.

Next, in a process shown in FIG. 2F, an entire surface of the polycrystalline silicon 202 is etched back, and the polycrystalline silicon 202 in a region other than an inside of the trench 105 is removed. Alternatively, a resist pattern is formed on the polycrystalline silicon 202, and by using this resist pattern as a mask, the, polycrystalline silicon 202 is selectively removed and patterned, for example, by using dry etching. In such a way, the polycrystalline silicon 202 in the region other than the inside of the trench 105 is removed.

Figure 2G:
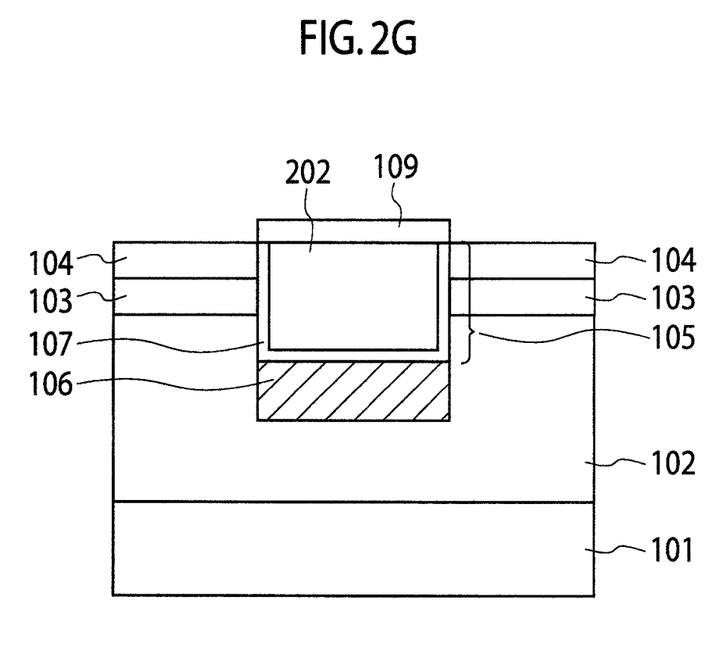
FIG. 2G is a process cross-sectional view showing the manufacturing method of the semiconductor device according to Embodiment 1 of the present invention.

Next, in a process shown in FIG. 2G, the interlayer insulating film 109 is selectively formed on the polycrystalline silicon 202. As the interlayer insulating film 109, a silicon oxidation film is suitably used. As a forming method, the interlayer insulating film 109 can be formed by thermally oxidizing the polycrystalline silicon 202 selectively. A thermal oxidation rate of polycrystalline silicon is more rapid than that of silicon carbide. Accordingly, in the case of performing the thermal oxidation for the polycrystalline silicon 202, the interlayer insulating film 109 can be formed on the polycrystalline silicon 202 in the self-alignment. Alternatively, first, the interlayer insulating film 109 is deposited by using the thermal CVD method, the plasma CVD method, the sputtering method and the like, and a resist pattern is formed on the deposited interlayer insulating film 109. Thereafter, by using this resist pattern as a mask, the interlayer insulating film 109 on the source region 104 may be selectively removed.

Figure 2H:
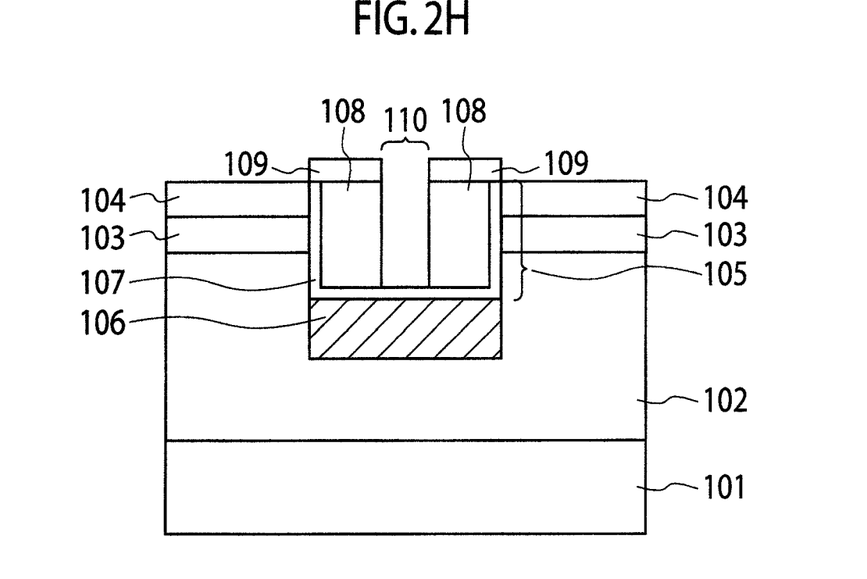
FIG. 2H is a process cross-sectional view showing the manufacturing method of the semiconductor device according to Embodiment 1 of the present invention.

Next, in a process shown in FIG. 2H, the contact hole 110 is opened and formed in the interlayer insulating film 109 and the polycrystalline silicon 202. As a forming method, there can be used dry etching using, as a mask, resist patterned by photolithography. In such a way, the gate electrode 108 made of polycrystalline silicon is formed so as to surround the contact hole 110. FIG. 2H illustrates the case where the gate insulating film 107 is left on a bottom portion of the contact hole 110. Meanwhile, an upper surface of a part of the anode region 106 may be exposed by selectively removing, by etching, the gate insulating film 107 on the bottom portion of the contact hole 110.

Figure 2I:
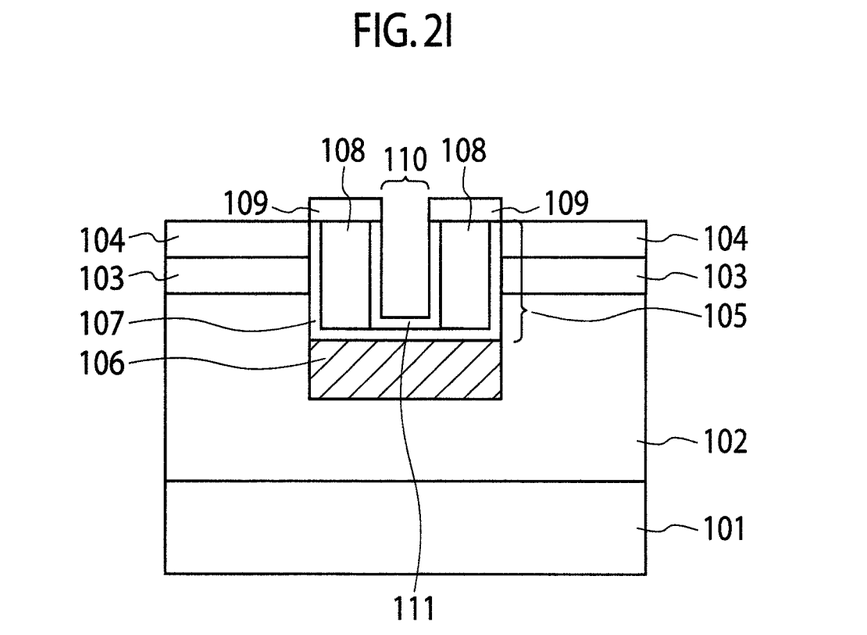
FIG. 2I is a process cross-sectional view showing the manufacturing method of the semiconductor device according to Embodiment 1 of the present invention.

Next, in a process shown in FIG. 2I, the inner wall insulating film 111 is formed on an inner wall of the contact hole 110, that is, on a side surface to which the gate electrode 108 is exposed. As a forming method, the inner wall insulating film 111 can be formed by thermally oxidizing the gate electrode 108 made of polycrystalline silicon. Alternatively, the inner wall insulating film 111 can be deposited and formed by using the thermal CVD method, the plasma CVD method, the sputtering method and the like.

Figure 2J:
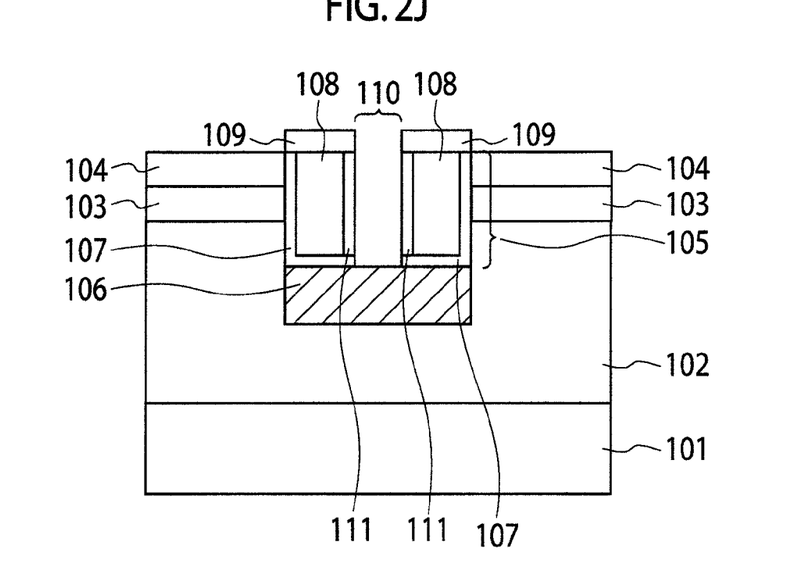
FIG. 2J is a process cross-sectional view showing the manufacturing method of the semiconductor device according to Embodiment 1 of the present invention.

Next, in a process shown in FIG. 2J, the surface of the anode region 106 immediately under the contact hole 110 is selectively exposed. As an exposure method, the gate insulating film 107 on the bottom portion of the contact hole 110 is selectively removed by anisotropic dry etching.

At this time, the interlayer insulating film 109 is formed thicker in advance than the gate insulating film 107 left on the bottom surface of the contact hole 110 and than the inner wall insulating film 111. In such a way, the interlayer insulating film 109 can be left even after the gate insulating film 107 left on the bottom surface of the contact hole 110 is etched. Moreover, by using the anisotropic dry etching, it becomes possible to selectively remove, by etching, the gate insulating film 107 on the bottom portion of the trench 105 without etching the inner wall insulating film 111 on the inner wall of the contact hole 110. By implementing the process as described above, the contact hole 110 can be formed in the trench 105 in the self-alignment so as to be surrounded by the gate electrode 108.

Subsequently, the source electrode 112 is deposited and formed so as to connect to the well region 103, the source region 104 and the anode region 106 in the ohmic contact at an electrically low resistance. Moreover, the drain electrode 113 is deposited and formed on the other of the main surfaces of the semiconductor substrate 101.

As the source electrode 112 and the drain electrode 113, nickel silicide is suitably used; however, alloys of cobalt silicide, titanium silicide and the like may be used. As a deposition method, an evaporation method, the sputtering method, the CVD method and the like can be used. Moreover, an electrode structure with a stacked structure, in which titanium and aluminum are stacked on the source electrode 112 or on the drain electrode 113, may be adopted. As a forming method of the nickel silicide, first, nickel is deposited, and is thereafter annealed at a temperature of 1000° C., and the nickel is alloyed with silicon carbide.

By being subjected to the processes described above, the semiconductor device according to Embodiment 1, which is shown in FIG. 1, is completed.

Next, a description is made of basic operations in the semiconductor device with the configuration shown in FIG. 1.

The semiconductor device with the configuration shown in FIG. 1 controls a potential of the gate electrode 108 in a state where a predetermined positive potential is applied to the drain electrode 113 while taking a potential of the source electrode 112 as a reference, and thereby functions as a transistor. That is to say, when a voltage between the gate electrode 108 and the source electrode 112 is set at a predetermined threshold voltage or more, an inversion layer is formed in a channel region of the well region 103 on the side surface of the gate electrode 108. In such a way, the transistor turns to an ON state, and a current flows from the drain electrode 113 to the source electrode 112.

Meanwhile, when the voltage between the gate electrode 108 and the source electrode 112 is set at the predetermined threshold voltage or less, the inversion layer disappears, and the transistor turns to an OFF state, and the current is shut off. In this state, a voltage as high as several hundred to several thousand voltages is applied between the drain and the source depending on voltages applied to the source electrode 112 and the drain electrode.

In the case where a predetermined negative potential is applied to the drain electrode 113 while taking the potential of the source electrode 112 as a reference, a reflux current flows through a diode in which the P-type well region 103 and the anode region 106 are used as an anode, and the N-type drift region 102 is used as a cathode. That is to say, this diode will function as a reflux diode.

As described above, in Embodiment 1 described above, the anode region 106 is formed in the drift region 102 immediately under the trench 105, whereby the drift region 102 immediately under the trench 105 becomes usable as a formed region of the reflux diode. In such a way, in comparison with the case of forming the diode in the plane direction with respect to the substrate along the gate electrode as heretofore, such area efficiency of the substrate in the event of forming the element can be enhanced. Hence, it is possible to enhance the integration degree of the semiconductor device including the transistor and the reflux diode.

Moreover, through the contact hole 110 formed so as to penetrate the gate electrode 108, the anode region 106 formed in the drift region 102 immediately under the trench 105 and the source electrode 112 are connected to each other at an electrically low resistance. In such a way, it becomes possible to reduce parasitic resistance between the anode region 106 and the source electrode 112, and a low-loss semiconductor device, in which a loss at the time of a reflux operation is reduced, can be provided.

In general, in the case of a MOSFET formed on a silicon carbide substrate, a drain electric field becomes higher in comparison with a MOSFET formed on a silicon substrate, and accordingly, heretofore, such a countermeasure as thickening the bottom portion has been required. Therefore, the ON-resistance of the MOSFET has been deteriorated.

As opposed to this, in Embodiment 1 described above, the anode region 106 is formed in the drift region 102 immediately under the trench 105, whereby the drain electric field to be applied to the bottom portion of the gate insulating film 107 at the time when the MOSFET is OFF can be relaxed. As a result, the low-loss semiconductor device including the reflux diode can be provided while suppressing the deterioration of the ON resistance of the MOSFET.

In general, it is difficult to form a low-resistance P-type region in silicon carbide. Moreover, in order to relax the drain electric field, a concentration gradient is necessary, in which the bottom portion of the P-type anode region 106 is set at a low concentration, and an upper portion thereof is set at a high concentration. Hence, if only the anode region 106 is formed in the drift region 102 immediately under the trench 105, then sheet resistance of the anode region 106 in a depth direction of FIG. 1 is increased, and there occurs the deterioration of the parasitic resistance, which is caused by an in-plane variation of the reflux current and by the sheet resistance.

As opposed to this, in Embodiment 1 described above, the anode region 106 is directly connected to the source electrode 112 at a low resistance immediately above the same, and accordingly, it becomes possible to suppress the in-plane variation of the reflux current.

The diode that uses the anode region 106 as an anode is a PN junction-type diode, and accordingly, has the same threshold voltage as that of a PN junction-type diode formed in the well region 103 and the drift region 102. Therefore, a uniform reflux current flows in the plane at the time of the reflux operation, and accordingly, an occurrence of a current variation can be suppressed.

In Embodiment 1 described above, first, the trench 105 is formed, which has the depth penetrating the well region 103 and the source region 104 and reaching the drift region 102. Then, the anode region 106 is formed in the drift region 102 immediately under the trench 105. Subsequently, the gate electrode 108 is embedded in the trench 105 while interposing the gate insulating film 107 therebetween, and in the gate electrode 108, the contact hole 110 that exposes the surface of the anode region 106 is formed. Thereafter, the source electrode 112 to be electrically connected to the anode region 106 in a state of being insulated from the gate electrode 108 by the inner wall insulating film 111 is embedded and formed in the contact hole 110. By being subjected to the manufacturing processes as described above, the reflux diode can be formed in the drift region 102 immediately under the trench 105. In such a way, in comparison with the case of forming the diode in the plane direction with respect to the substrate along the gate electrode as heretofore, the area efficiency of the substrate in the event of forming the element can be enhanced. Hence, a manufacturing method of enhancing the integration degree of the semiconductor device including the transistor and the reflux diode can be provided.

In the contact hole 110 formed in the gate electrode 108 in the trench 105, the source electrode 112 is embedded and formed while interposing the inner wall insulating film 111 therebetween, whereby it becomes possible to electrically connect the anode region 106, which is formed in the drift region 102 immediately under the trench 105, and the source region 112 to each other in a state of being insulated from the gate electrode 108. In such a way, the anode region 106 and the source electrode 112 can be connected to each other at a low resistance in a state of being insulated from the gate electrode 108. As a result, a manufacturing method capable of manufacturing the low-loss semiconductor device can be provided.

The interlayer insulating film 109 is formed thicker in advance than the gate insulating film 107 left on the bottom surface of the contact hole 110 and than the inner wall insulating film 111. In such a way, the interlayer insulating film 109 can be left even after the gate insulating film 107 left on the bottom surface of the contact hole 110 is etched. As a result, the diode can be formed immediately under the trench 105 with good controllability.

In the event of etching the gate insulating film 107 left on the bottom surface of the contact hole 110, the anisotropic dry etching is used. In such a way, without removing, by etching, the inner wall insulating film 111 on the inner wall of the contact hole 110, the gate insulating film 107 can be selectively removed, and the surface of the anode region 106 can be exposed. As a result, it becomes possible to form the contact hole 110 in the self-alignment, and such a low-loss semiconductor device, in which the diode is formed in the drift region 102 immediately under the trench 105, can be formed with good controllability.

(Embodiment 2)

Figure 3:
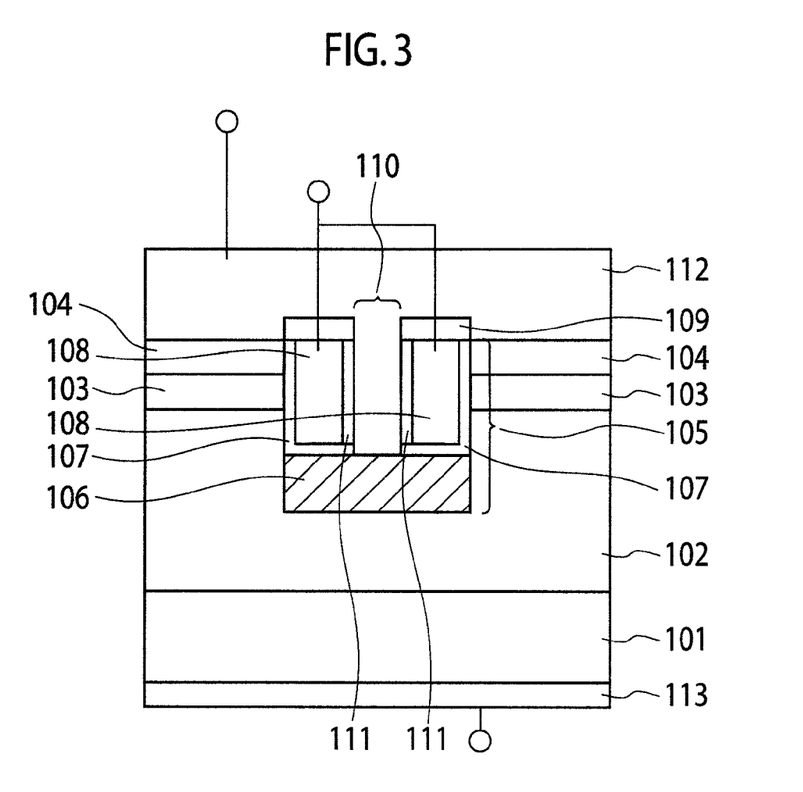
FIG. 3 is a cross-sectional view showing a configuration of a semiconductor device according to Embodiment 2 of the present invention.

FIG. 3 is a cross-sectional view showing a configuration of a semiconductor device according to Embodiment 2 of the present invention.

Embodiment 2 is different from Embodiment 1 in that an anode region 106 is formed on the bottom portion of the trench 105, and that this anode region 106 is formed of a different type of material different from silicon carbide that composes the drift region 102. Other configurations and basic operations are similar to those of Embodiment 1 mentioned above, and accordingly, are omitted here.

While the anode region 106 of Embodiment 1 mentioned above is formed in the drift region 102 immediately under the trench 105, the anode region 106 of this Embodiment 2 is formed on the bottom portion of the trench 105.

As the different type of material that composes the anode region 106, there can be used: a metal material such as titanium, aluminum, nickel, molybdenum; or a semiconductor material, for example, such as polycrystalline silicon, which is different in band gap from the drift region 102. In the case where the anode region 106 is formed of a metal material, a Schottky junction is formed on a junction surface between the anode region 106 and the drift region 102, and a Schottky diode is composed of both thereof. This Schottky diode has a function to flow the reflux current in a similar way to the PN junction-type diode described in Embodiment 1 mentioned above.

Meanwhile, the Schottky diode is a unipolar diode, and can compose a low-loss diode in which a reverse recovery charge is suppressed in comparison with the diode (bipolar diode) of Embodiment 1.

Figure 4A:
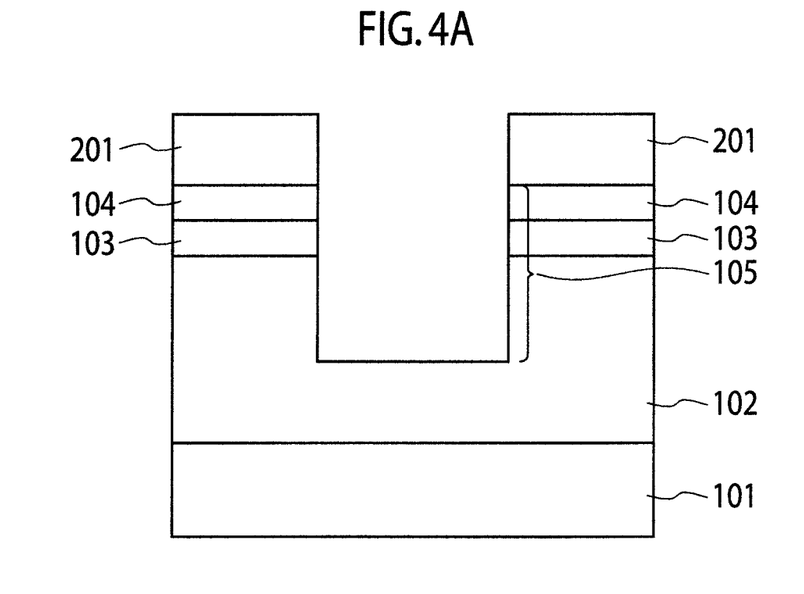
FIG. 4A is a process cross-sectional view showing a manufacturing method of the semiconductor device according to Embodiment 2 of the present invention.
Figure 4B:
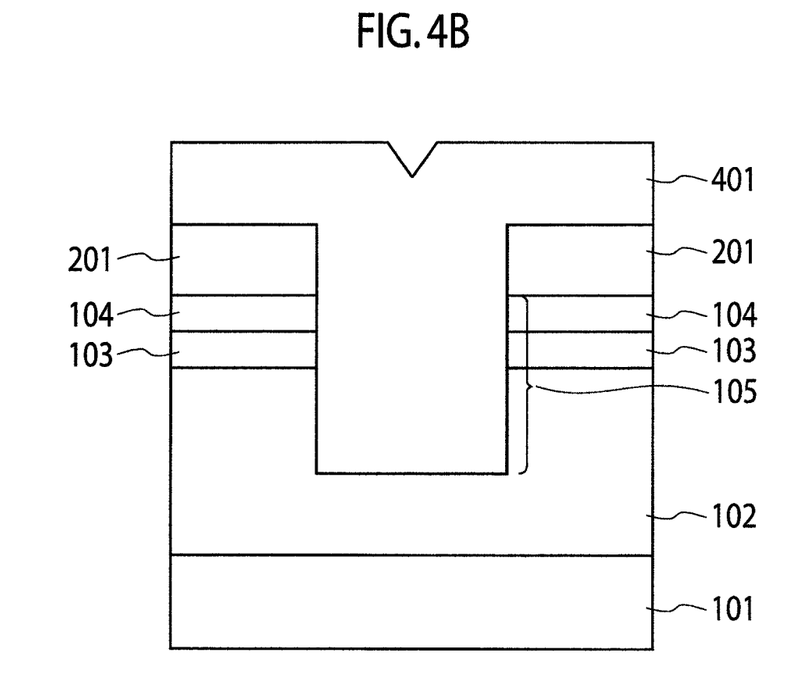
FIG. 4B is a process cross-sectional view showing the manufacturing method of the semiconductor device according to Embodiment 2 of the present invention.
Figure 4C:
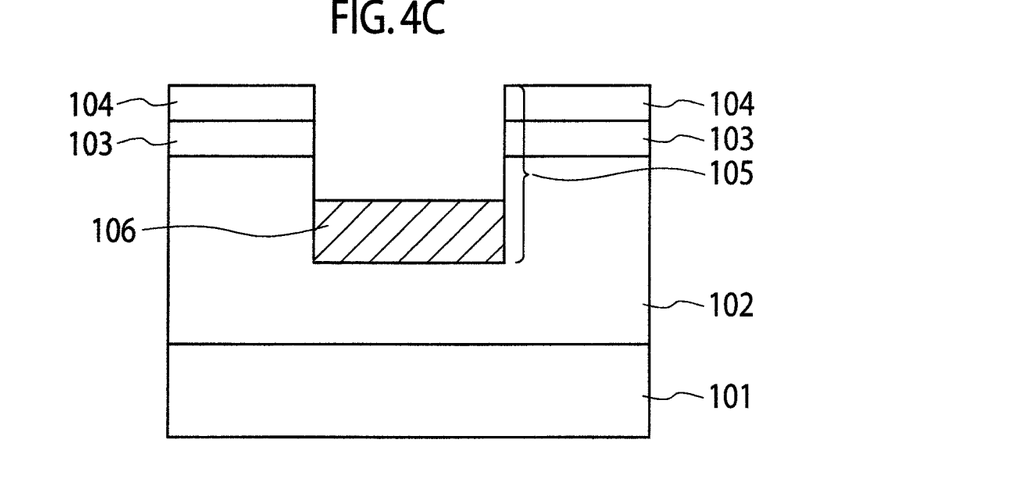
FIG. 4C is a process cross-sectional view showing the manufacturing method of the semiconductor device according to Embodiment 2 of the present invention.

Next, by using FIGS. 4A to 4C, a description is made of a manufacturing method of a semiconductor device in the event of forming the anode region 106 of polycrystalline silicon. Note that processes before a process shown in FIG. 4A are similar to the processes shown in FIG. 2A and FIG. 2B of Embodiment 1 mentioned above.

After the process shown in FIG. 2B is ended, in the process shown in FIG. 4A, the trench 105 is formed by using the mask material 201 in a similar way to the process shown in FIG. 2C shown above. At this time, if a depth at which the anode region 106 is to be formed is a similar depth to that of FIG. 2C, a different point here from the process shown in FIG. 2C is that the trench 105 is formed deeper than the trench 105 formed in the process shown in FIG. 2C. This is because the anode region 106 is formed on the bottom portion in the trench 105 in this Embodiment 2 while the anode region 106 is formed in the drift region 102 immediately under the trench 105 in Embodiment 1 mentioned above.

Next, in a process shown in FIG. 4B, polycrystalline silicon 401 is deposited and formed on an entire surface of the semiconductor device so as to be filled at least into the trench 105. As a deposition method, such a general low-pressure CVD method can be used.

Next, in a process shown in FIG. 4C, an entire surface of the polycrystalline silicon 401 thus deposited and formed is etched back, and the mask material used in the process shown in FIG. 4A shown above and the polycrystalline silicon 401 in a region other than the bottom portion of the trench 105 are selectively removed. In such a way, the anode region 106 made of the polycrystalline silicon 401 as the different type of material is formed on the bottom portion of the trench 105.

Processes which follow are similar to the process shown in FIG. 2E of Embodiment 1, which is mentioned above, and after, and accordingly, are omitted here.

As described above, in Embodiment 2 described above, the anode region 106 having a similar function to that of Embodiment 1 mentioned above is formed on the bottom portion of the trench 105, and accordingly, similar effects to the effects obtained in Embodiment 1 can be obtained.

Moreover, in this Embodiment 2, the anode region 106 is formed of the different type of material different from the silicon carbide of the drift region 102, whereby the unipolar diode is composed between the anode region 106 and the drift region 102. The unipolar diode can suppress the reverse recovery charge in comparison with the diode (bipolar diode) of Embodiment 1 mentioned above. In such a way, a semiconductor device including the low-loss diode can be provided.

Furthermore, the anode region 106 is formed of polycrystalline silicon. In such a way, a hetero junction by junction of semiconductors different in band gap from each other is formed on the junction surface between the anode region 106 and the drift region 102. As a result, a hetero junction-type diode, in which the anode region 106 made of polycrystalline silicon is used as an anode and the drift region 102 of silicon carbide is used a cathode, is composed. Such a hetero junction diode formed of silicon carbide operates as a unipolar diode, for example, as described in a patent literature of Japanese Patent No. 4211642. Therefore, in comparison with the diode of Embodiment 1 mentioned above, it becomes possible to suppress the reverse recovery charge, and the semiconductor device including the low-loss diode can be provided.

The anode region 106 is formed of polycrystalline silicon, whereby, in comparison with the case of forming the anode region 106 of metal or an alloy, metal contamination to the gate insulating film 107 is suppressed, and the interface state can be suppressed from being increased. In such a way, the ON resistance of the MOSFET is suppressed from being increased, and the low-loss semiconductor device can be provided.

The silicon oxidation film can be formed by oxidizing polycrystalline silicon. In such a way, in the case where the gate insulating film 107 is formed by the thermal oxidation, the side surface and bottom surface of the gate insulating film 107 can be formed of the same silicon oxidation film. As a result, it becomes possible to suppress an electric field concentration owing to discontinuity of the materials which form the gate insulating film 107, and a semiconductor device with high reliability can be provided.

(Embodiment 3)

FIG. 5 to FIG. 8 are plan views showing layouts in a plane direction (main surface direction of a semiconductor substrate) of a semiconductor device according to Embodiment 3 of the present invention.

Figure 5:
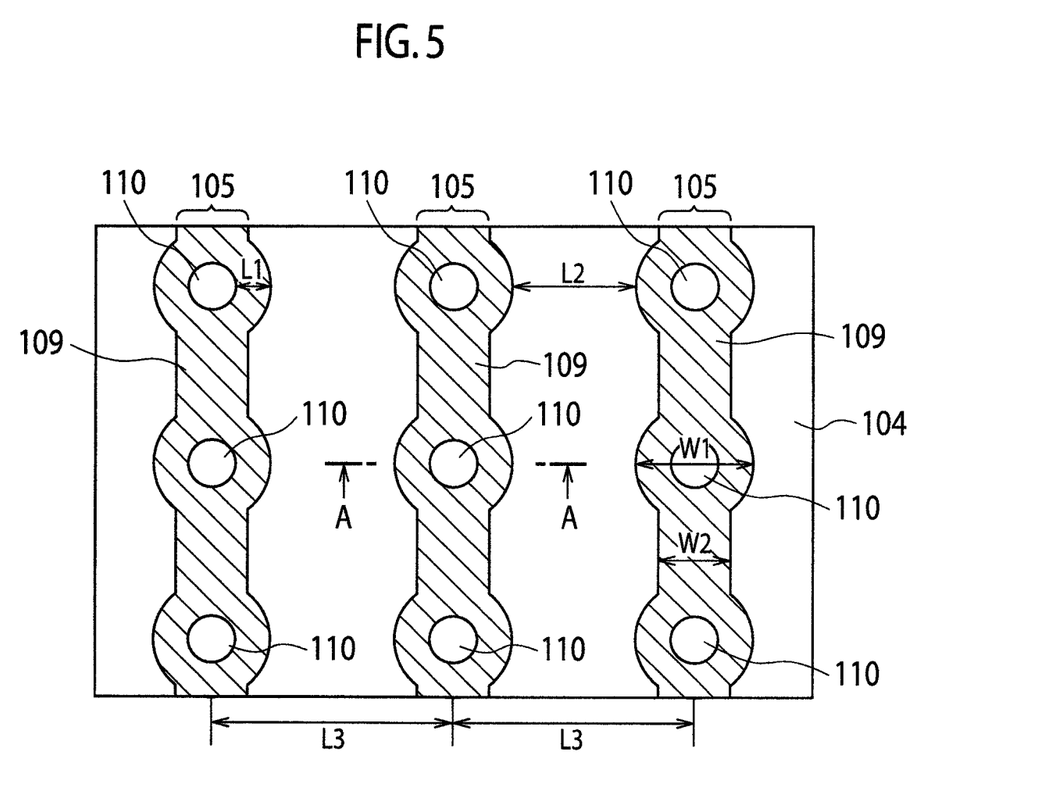
FIG. 5 is a plan view showing a configuration of a semiconductor device according to Embodiment 3 of the present invention.

FIG. 5 to FIG. 8 are views when states where the source electrode 112 of the semiconductor device shown in FIG. 1 is removed are viewed, and a cross-section along a line A-A of FIG. 5 corresponds to the cross section shown in FIG. 1. In each of layout examples shown in FIG. 5 to FIG. 8, the contact holes 110 formed in the trenches 105 are arrayed intermittently (discretely). Here, the following description is made while defining, in each of FIG. 5 to FIG. 8, a lateral direction of a sheet surface with respect to the plane (main surface) of the semiconductor substrate 101 as an X-direction, and defining a longitudinal direction thereof as a Y-direction.

In a configuration shown in FIG. 5, a plurality of the trenches 105 is formed continuously (linearly) in the Y-direction on the plane (main surface) of the semiconductor substrate 101, and is arranged discretely in parallel to one another in the X-direction. The contact holes 110 formed in the trenches 105 are arranged discretely with respect to the individual trenches 105. The contact holes 110 formed in the trenches 105 adjacent to one another are arranged linearly in the X-direction. The trenches 105 are formed so that a width (W1) thereof in portions in which the contact holes 110 are formed can be larger than a width (W2) thereof in portions in which the contact holes 110 are not formed (W1>W2).

By adopting such a configuration, in addition to the effects obtained in Embodiments 1 and 2 mentioned above, it becomes possible to lengthen a length (channel width of the transistors) of peripheries of the trenches 105 while keeping a distance (L1) between the trenches and the contact holes at a value predetermined by specifications and the like. In such a way, it becomes possible to reduce the ON-resistance of the MOSFET, and the low-loss semiconductor device can be provided. Here the distance (L1) between the trenches and the contact holes is a distance between the side surfaces of the trenches and the side surfaces of the contact holes 110.

Figure 6:
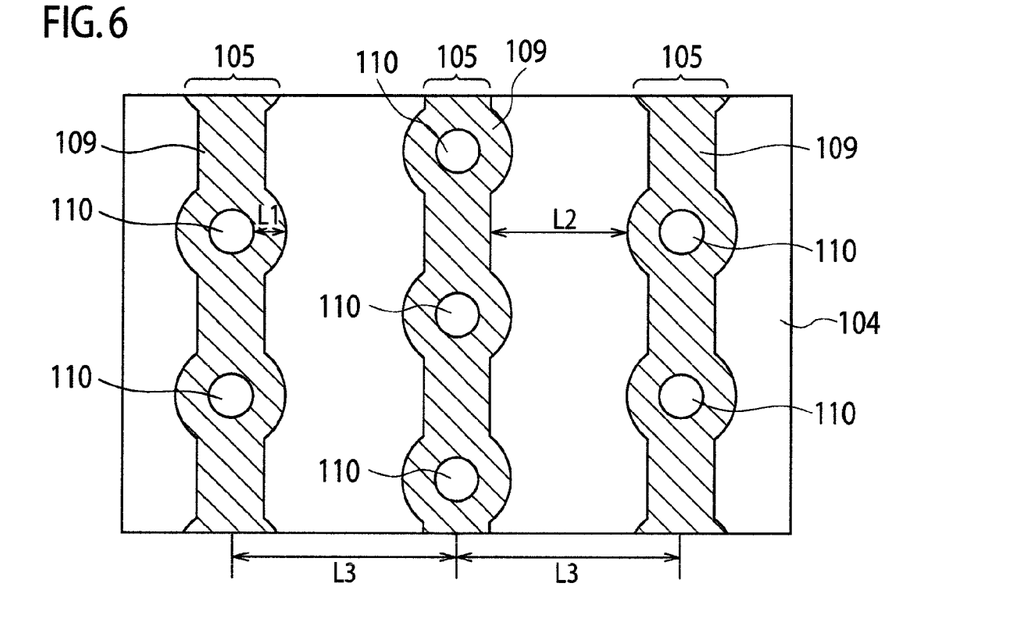
FIG. 6 is a plan view showing another configuration of the semiconductor device according to Embodiment 3 of the present invention.

In a configuration shown in FIG. 6, with respect to the configuration shown in FIG. 5, the contact holes 110 formed in the individual trenches 105 adjacent to one another are arranged alternately (so as not to be opposite to one another). Others are similar to those of the configuration of FIG. 5.

By adopting such a configuration, in comparison with the configuration shown in FIG. 5, it becomes possible to shorten a gate pitch (L3) in comparison with that of the configuration shown in FIG. 5 shown above while maintaining an inter-gate electrode distance (L2) similarly to that of the configuration shown in FIG. 5. In such a way, in comparison with the configuration shown in FIG. 5, the integration degree of the semiconductor device can be further enhanced. Moreover, it becomes possible to reduce the ON-resistance of the MOSFET, and the low-loss semiconductor device can be provided. Here, as shown in FIG. 5 and FIG. 6, the inter-gate electrode distance (L2) is a distance between the gate electrodes 108 formed in the trenches 105 adjacent to one another, and the gate pitch (L3) is a distance between centers of the trenches 105 adjacent to one another.

Figure 7:
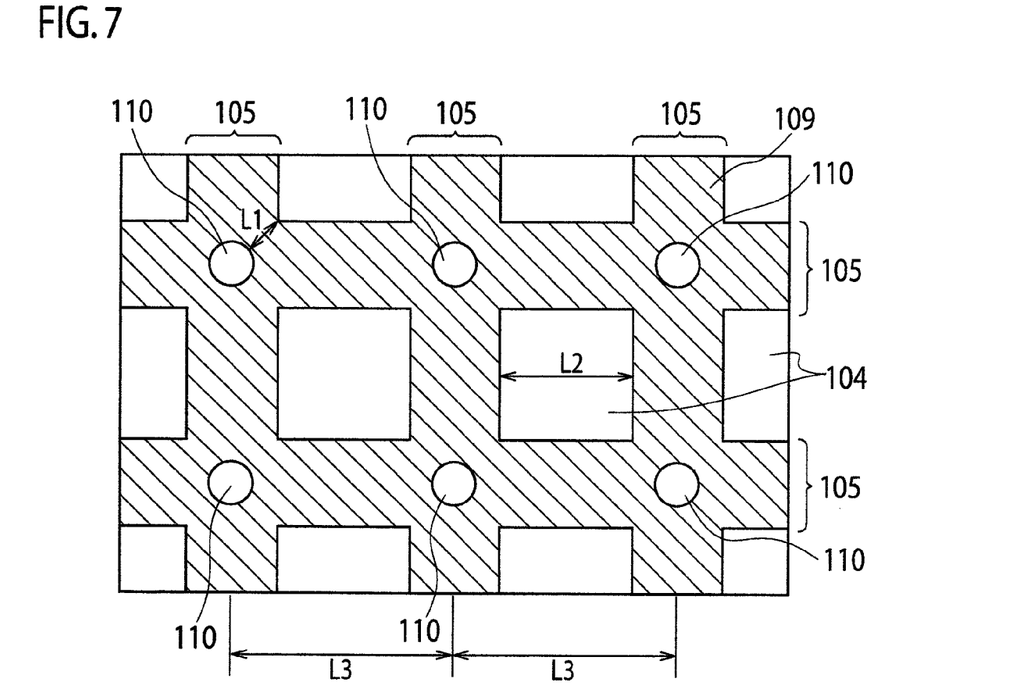
FIG. 7 is a plan view showing another configuration of the semiconductor device according to Embodiment 3 of the present invention.

In a configuration shown in FIG. 7, the trenches 105 are formed into a mesh shape. In this mesh, each section thereof has a quadrangular shape as shown in FIG. 7. The contact holes 110 are arranged on individual intersections of the mesh (that is, on portions at which the longitudinal and lateral trenches 105 intersect one another).

By adopting such a configuration, it becomes possible to enhance a density of the mesh while keeping the distance (L1) between the trenches and the contact holes at the value predetermined by the specifications and the like. In such a way, the integration degree of the semiconductor device can be enhanced. Moreover, it becomes possible to reduce the ON-resistance of the MOSFET, and the low-loss semiconductor device can be formed with good controllability.

In a configuration shown in FIG. 8, the trenches 105 are formed into a mesh shape in a similar way to the case in FIG. 7 shown above; however, the configuration shown in FIG. 8 is different from that shown in FIG. 7 in that each section of the mesh has a hexagonal shape. The contact holes 110 are arranged on individual vertices of the mesh (that is, on portions at which the trenches 105 intersect one another).

Figure 8:
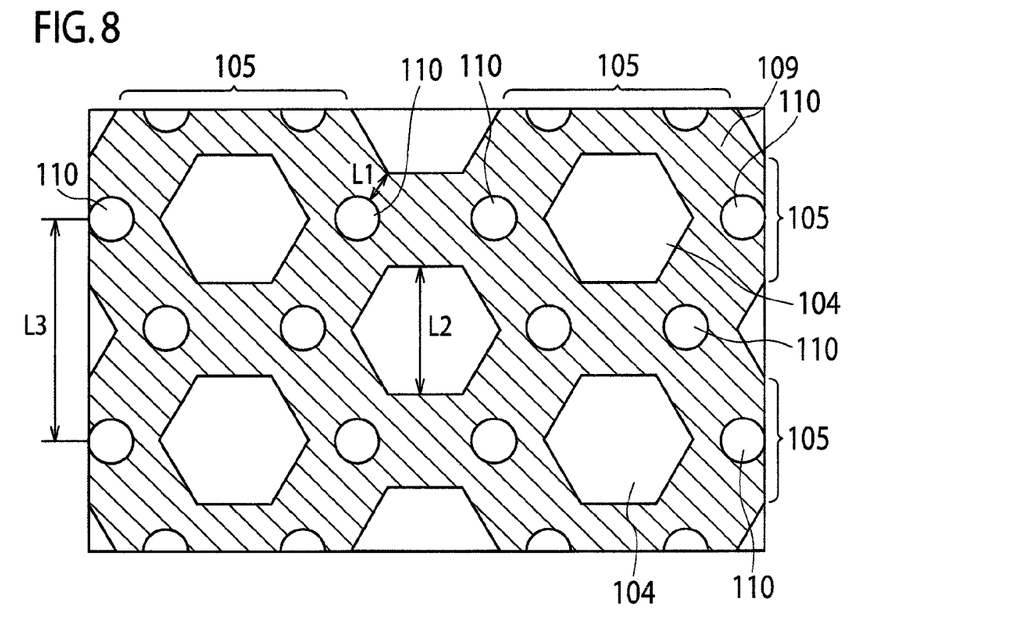
FIG. 8 is a plan view showing another configuration of the semiconductor device according to Embodiment 3 of the present invention.

By adopting such a configuration, it becomes possible to enhance the density of the mesh while keeping the distance (L1) between the trenches and the contact holes at the value predetermined by the specifications and the like. In such a way, the integration degree of the semiconductor device can be enhanced. Moreover, it becomes possible to reduce the ON-resistance of the MOSFET, and the low-loss semiconductor device can be formed with good controllability.

Note that, though the above description illustrates the case where the shape of each section of the mesh is the quadrangular shape and the hexagonal shape, the shape of the section may be other polygonal shapes or circular. In that case, the contact holes 110 can be arranged on vertices of a polygon or along a circumference of a circle.

(Embodiment 4)

Figure 9:
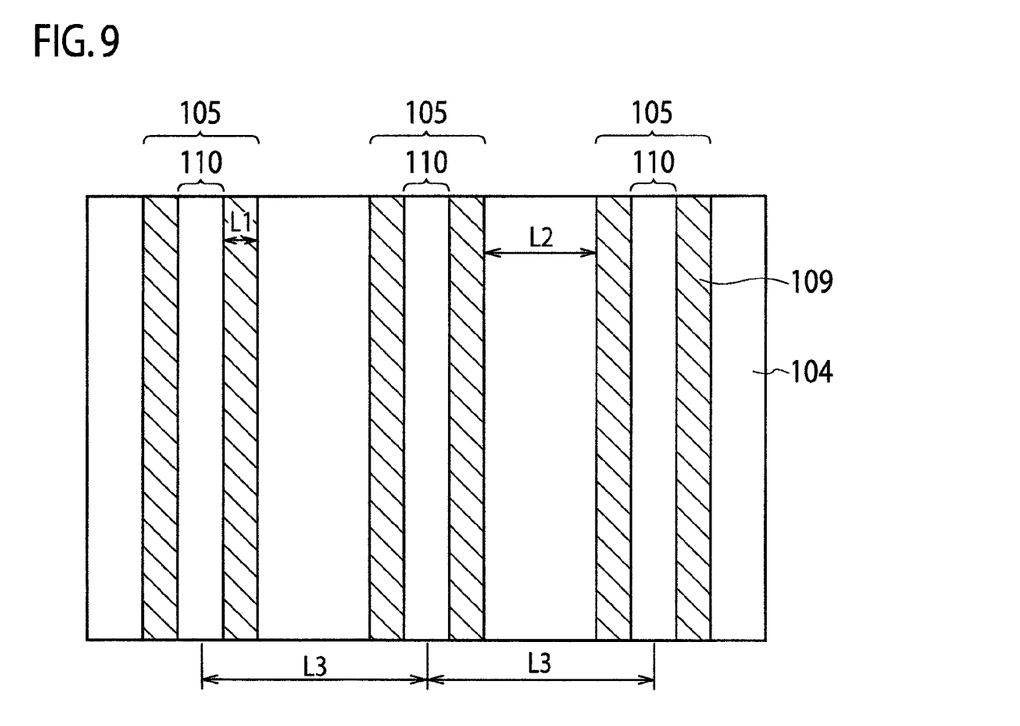
FIG. 9 is a plan view showing a configuration of a semiconductor device according to Embodiment 4 of the present invention.
Figure 10:
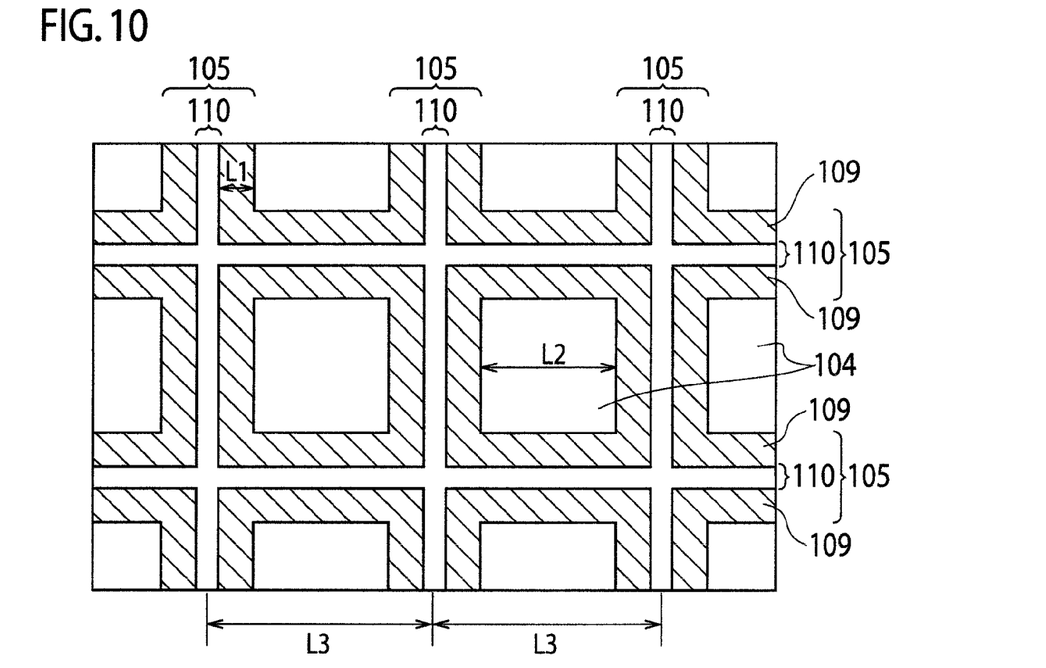
FIG. 10 is a plan view showing another configuration of the semiconductor device according to Embodiment 4 of the present invention.
Figure 11:
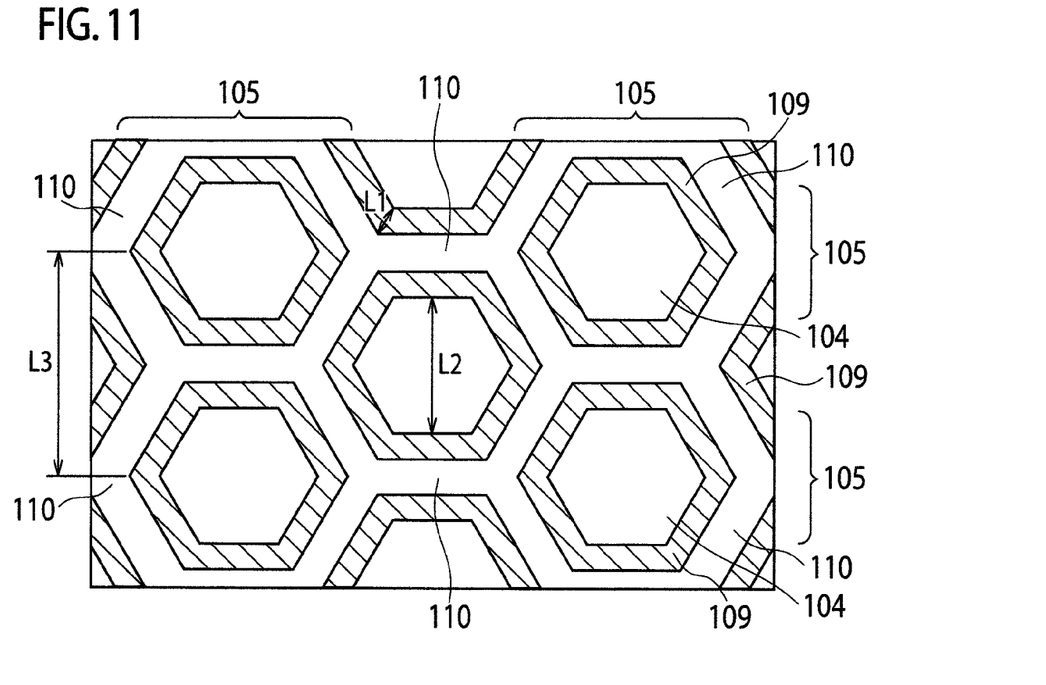
FIG. 11 is a plan view showing another configuration of the semiconductor device according to Embodiment 4 of the present invention.

FIG. 9 to FIG. 11 are plan views showing layouts in a plane direction (main surface direction of a semiconductor substrate) of a semiconductor device according to Embodiment 4 of the present invention.

FIG. 9 to FIG. 11 are views when states where the source electrode 112 of the semiconductor device shown in FIG. 1 is removed are viewed. While the contact holes 110 are arranged discretely in FIG. 5 to FIG. 8, which are shown above, the contact holes 110 are formed continuously in each of layout examples shown in FIG. 9 to FIG. 11.

In a configuration shown in FIG. 9, the contact holes 110 are formed on straight lines along the insides of the trenches 105 formed in a longitudinal direction of a sheet surface.

By adopting such a configuration, the contact holes 110 are formed continuously, and accordingly, it becomes possible for the anode regions 106 to connect to the source electrodes 112 continuously embedded in the contact holes 110 immediately above the same. In such a way, a contact area between the anode regions 106 and the source electrodes 112 is increased, and both thereof can be connected to each other at a low resistance. As a result, such a low-loss semiconductor device in which the ON-resistance of the diode is reduced can be provided.

In a configuration shown in FIG. 10, the trenches 105 are formed into a mesh shape in which each section is quadrangular in a similar way to the case shown in FIG. 7 shown above, and the contact holes 110, and the contact holes 110 are also formed continuously into a mesh shape along the insides of the trenches 105 with the mesh shape.

In a configuration shown in FIG. 11, the trenches 105 are formed into a mesh shape in which each section is hexagonal in a similar way to the case shown in FIG. 8 shown above, and the contact holes 110 are also formed continuously into a mesh shape along the insides of the trenches 105 with the mesh shape.

By adopting such configurations, the contact holes 110 are formed continuously, and accordingly, it becomes possible for the anode regions 106 to connect to the source electrodes 112 continuously embedded in the contact holes 110 immediately above the same. In such a way, the contact area between the anode regions 106 and the source electrodes 112 is increased, and both thereof can be connected to each other at a low resistance. As a result, the low-loss semiconductor device in which the ON-resistance of the diode is reduced can be provided.

As above, in the respective Embodiments 1 to 4 mentioned above, while a unit cell is illustrated in each cross-sectional view of the semiconductor devices, a parallel connection structure in which a plurality of the unit cells is aggregated and repeated may be formed. Moreover, an electric field relaxation structure composed of a guard ring or a termination structure may be provided on an outermost peripheral portion of the device.

This application claims priority based on Japanese Patent Application No. 2011-092962 filed on Apr. 19, 2011, and the contents of this application are incorporated in the specification of the present invention by reference.

INDUSTRIAL APPLICABILITY

In accordance with the present invention, the anode region is formed in the bottom portion of the trench in which the gate electrode is formed or in the drift region immediately under the trench. Accordingly, with respect to the gate electrode, the diode can be formed in the vertical direction of the substrate. As a result, the area efficiency of the element in the semiconductor substrate is enhanced, whereby the integration degree can be enhanced.

The invention claimed is:

1. A semiconductor device comprising:
   a semiconductor substrate;
   a drift region of first conductivity type formed on one of main surfaces of the semiconductor substrate;
   a well region of second conductivity type formed in the drift region;
   a source region of first conductivity type formed in the well region;
   a trench with a depth penetrating the source region and the well region and reaching the drift region;
   a gate electrode formed on a side portion of the trench while interposing a gate insulating film therebetween;
   a source electrode connected to the well region and the source region;
   a drain electrode connected to other of the main surfaces of the semiconductor substrate;
   an interlayer insulating film that is formed on the gate electrode and coats the gate electrode;
   an anode region formed on a bottom portion of the trench or in the drift region immediately under the trench;
   a contact hole formed in the trench at a depth reaching the anode region; and
   an inner wall insulating film formed on an inner wall side surface of the contact hole while being in contact with the gate electrode,
   wherein the source electrode is embedded in the contact hole while interposing the inner wall insulating film between the source electrode and the gate electrode, and is electrically connected to the anode region in a state of being insulated from the gate electrode by the inner wall insulating film, and
   a plurality of contact holes is formed discretely in the trench with respect to a main surface direction of the semiconductor substrate, and a width of the trench at portions in which the contact holes are formed is wider than a width of the trench at portions in which the contact holes are not formed.

2. The semiconductor device according to claim 1, wherein the anode region is formed as a second conductivity type region in the drift region, and composes a PN junction-type diode on a junction surface with the drift region, the PN junction-type diode using the drift region as a cathode.

3. The semiconductor device according to claim 1, wherein the anode region is formed of a material different from the drift region on the bottom portion of the trench, and composes a unipolar diode on a junction surface with the drift region.

4. The semiconductor device according to claim 3, wherein the anode region is formed of a semiconductor different in band gap from the drift region.

5. The semiconductor device according to claim 1, wherein a plurality of the trenches is formed linearly with respect to the main surface direction of the semiconductor substrate, and a plurality of the contact holes is formed discretely in the trenches with respect to the main surface direction of the semiconductor substrate, and the contact holes formed in the trenches adjacent to one another are arranged and formed alternately so as not to be opposite to one another.

6. A semiconductor device comprising:
a semiconductor substrate;
a drift region of first conductivity type formed on one of main surfaces of the semiconductor substrate;
a well region of second conductivity type formed in the drift region;
a source region of first conductivity type formed in the well region;
a trench with a depth penetrating the source region and the well region and reaching the drift region;
a gate electrode formed on a side portion of the trench while interposing a gate insulating film therebetween;
a source electrode connected to the well region and the source region;
a drain electrode connected to other of the main surfaces of the semiconductor substrate;
an interlayer insulating film that is formed on the gate electrode and coats the gate electrode;
an anode region formed on a bottom portion of he trench or in the drift region immediately under the trench;
a contact hole formed in the trench at a depth reaching the anode region; and
an inner wall insulating film formed on an inner wall side surface of the contact hole while being in contact with the gate electrode,
wherein the source electrode is embedded in the contact hole while interposing the inner wall insulating film between the source electrode and the gate electrode, and is electrically connected to the anode region in a state of being insulated from the gate electrode by the inner wall insulating film,
the anode region is formed of a semiconductor different in band gap from the drift region, and
a plurality of contact holes is formed discretely in the trench with respect to a main surface direction of the semiconductor substrate.

7. The semiconductor device according to claim 6, wherein a plurality of trenches is formed into a mesh shape with respect to the main surface direction of the semiconductor substrate, and the plurality of contact holes is arranged and formed discretely on mesh intersections of the trenches.

8. The semiconductor device according to claim 6, wherein the trench is formed linearly with respect to a main surface direction of the semiconductor substrate, and the contact holes are formed linearly along an inside of the trench.

9. The semiconductor device according to claim 6, wherein the trench is formed into a mesh shape with respect to a main surface direction of the semiconductor substrate, and the contact holes are formed into a mesh shape along an inside of the trench.

* * * * *